May 14, 1963 J. R. WILLIAMS 3,089,219
TRANSISTOR ASSEMBLY AND METHOD
Filed Oct. 19, 1953 2 Sheets-Sheet 1

INVENTOR
JOHN R. WILLIAMS
BY [signature]
ATTORNEY

INVENTOR
JOHN R. WILLIAMS
BY Elmer J. Gorn
ATTORNEY

United States Patent Office 3,089,219

Patented May 14, 1963

3,089,219

TRANSISTOR ASSEMBLY AND METHOD

John R. Williams, Natick, Mass., assignor to Raytheon Company, a corporation of Delaware Filed Oct. 19, 1953, Ser. No. 386,977
2 Claims. (Cl. 29—25.3)

This invention relates to a mold assembly used to make fused junction type transistors, and more particularly to the structure of the mold assembly and the method employed to utilize the assembly so as to simultaneously fuse an emitter material, a collector material, and a base tab to a crystal of semiconductor material.

In the production of fused junction transistors it is desirable to combine as many steps of the process in one operation as is possible. For example, the emitter material, collector material, and the base tab of a transistor assembly are usually connected to the semiconductor crystal in separate steps each of which is time consuming, subject to human error and expensive. The inherent savings made by combining these steps in one operation are obtained by using the novel mold assembly and method of employ the same described below.

This invention involves the use of a mold assembly adapted to hold and pre-position the transistor components so that they can be simultaneously joined to form a basic transistor assembly. It should be noted that the primary problem of such a simultaneous fusing process is properly positioning the collector material so it will make good contact with the crystal while in the molten condition. Thus, the mold comprises two parts one of which is a tray in which a plurality of counter-sunk recesses have been drilled. Each of these recesses is designed to hold a collector material, semiconductor crystal and a base tab. The tray, which can be made of graphite for example, has at the bottom of each of the recesses therein a small cylindrical cavity adapted to hold the collector material, such as a small cylinder of indium, a p-type electrically conductive element. Directly above the collector cavity and adjacent thereto is a substantially rectangular chamber designed to support a thin rectangular chip of semiconductor material, such as a chip of single crystal germanium of n-type electrical conductivity. Slightly above this chamber and leading away therefrom is a channel employed to support a pre-tinned base tab, such as a strip of nickel, for example, so that the end section of the tab rests on an end section of the chip.

The second part of the mold assembly is an insert or washer. A plurality of these washers are used, by fitting each into a recess in the tray, to hold the transistor components in place and to prevent vibrations from destroying the critical alignment of these components. Each washer is also provided with a small tapered hole extending therethrough so that when the washer is properly positioned in a recess, the bottom end of the hole is adjacent to the upper side of the crystal chip and directly opposed to the collector material. The emitter material, such as a small bead of indium, is placed in the upper opening of the small hole. Thus, prior to heating the mold assembly, the transistor components have been aligned, with respect to their relative positions around the semiconductor crystal chip, so that the lower face of the chip is adjacent to and slightly separated from the cylindrically-shaped collector material, the upper face of the chip is positioned next to the lower opening of the tapered hole in the washer, and an end of the base tab lies on an end section of the chip.

By placing the mold assembly in an oven heated to a temperature above the melting point of the collector material, the emitter material and the solder on the base tab, but below that of the semiconductor crystal chips, a plurality of basic transistor assemblies can be formed in a single operation. The cylindrical collector material will melt, expand, and it tends to assume a spherical shape so that in the melted form this material touches and wets the lower face of the crystal chip and begins to alloy into the chip as the heating process progresses. Likewise, the emitter material will melt, pass through the lower opening in the washer, be deposited on the upper surface of the chip, and will slowly alloy into the chip during the heating process. Simultaneously, the base tab, which has been pre-tinned with a solder having a melting point below the temperature at which at the oven is heated, will be joined to the end section of the chip. The heating process is discontinued after a predetermined period during which a fused junction is formed, the mold assembly is cooled and the basic transistor components, which have been simultaneously joined, are removed. In the particular example given above, these transistors will be of the p-n-p diffused junction type. However, it should be noted that n-p type junction diodes and n-p-n type transistors can be formed as well.

This invention and the features thereof will be understood more clearly and fully from the following detailed description of one embodiment of the invention with reference to the accompanying drawings wherein.

Figure 1:
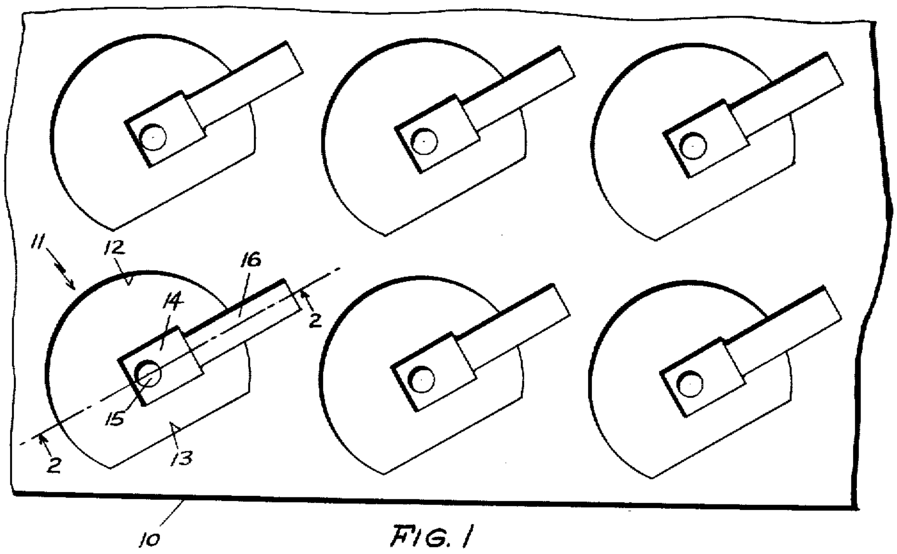
FIG. 1 is a partial top view of a tray made in accordance with this invention.
Figure 2:
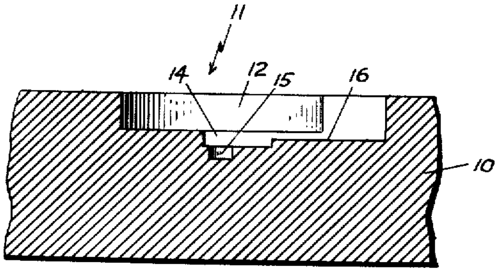
FIG. 2 is a partial cross-sectional view taken along line 2—2 in FIG. 1.
Figure 6:
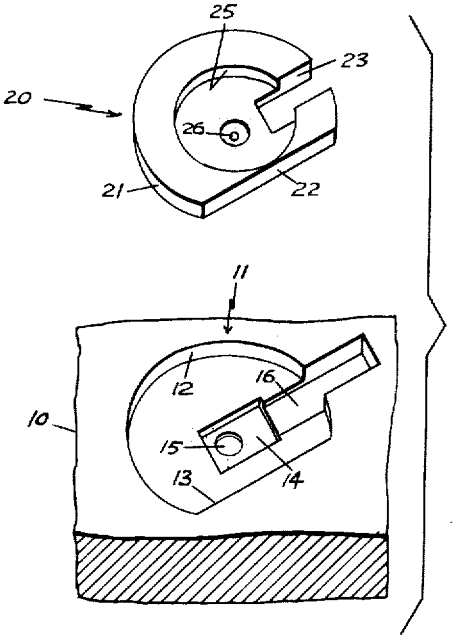
FIG. 6 is an exploded view of a mold assembly made in accordance with this invention.

Referring now to FIGS. 1, 2 and 6, a tray 10 which comprises one of the two sections of the mold assembly is shown. This tray consists of a plurality of recesses 11, six of which are illustrated in FIG. 1, drilled into a block of graphite, for example. The overall size of the tray is not limited in any way and depends upon the number of transistor assemblies desired to be formed in a single tray. For example, a tray 6 inches long, 1¼ inches wide and ¼ inch thick having thirty-three recesses drilled therein has been used successfully for the purposes of this invention. The recesses 11 are segment shaped cylinders; that is, one wall 12 is circular in shape and the wall 13 adjoining the end sections of the circular wall 12 is planar, as shown in FIGS. 1 and 6. The overall diameter of these recesses can be of the order of $\frac{3}{10}$ inch, for example.

Figure 7:
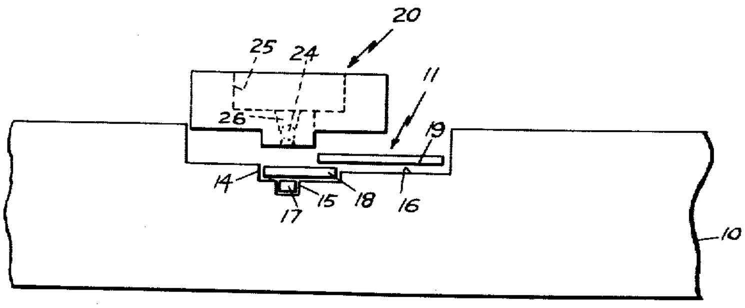
FIG. 7 is an exploded schematic view of the mold assembly and the transistor components aligned therein.

As shown in FIGS. 1, 2 and 6, the floor of each of the recesses 11 has a depression therein in the form of a rectangular shaped chamber 14 having a small cylindrical cavity 15 in the bottom thereof. Leading away from each chamber 14 and slightly raised above the level of the floor thereof is a channel 16. Thus, it may be seen, with reference to FIGS. 6 and 7, that a very small cylinder of collector material 17, such as indium, for example, can be placed in each cavity 15 in the recessed sections 11 of the tray 10. Likewise, a chip 18 of single crystal semiconductor material, such as a chip of n-type germanium for example, which has been formed in any of a number of ways well known in the art, can be supported on the floor of the chamber 14 in each recess. Similarly, a base tab 19 can be aligned within the channel 16 so that it slightly overlaps an end section of the chip 18, as shown in FIG. 7. The tab 19 can be a strip of nickel, for example, and should be pre-tinned with a suitable solder, such as a lead-tin solder, the melting point of which is substantially below the temperature of the oven wherein the above mentioned transistor components are to be fused.

Figure 3:
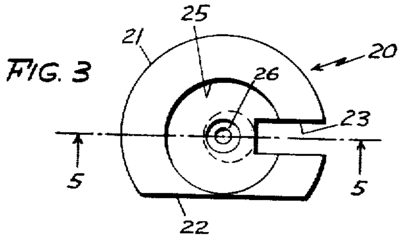
FIG. 3 is a top view of a washer made in accordance with this invention.
Figure 4:
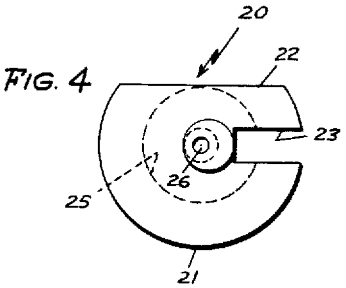
FIG. 4 is a bottom view of the washer.
Figure 5:
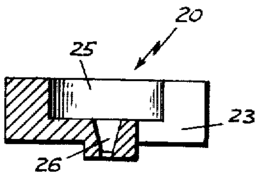
FIG. 5 is a cross-sectional view taken along line 5—5 in FIG. 3.

Referring to FIGS. 3, 4, 5 and 6, a washer 20 made in accordance with this invention and comprising the second section of the mold assembly is shown. The washer 20 is one of a plurality of washers each of which is designed to fit into a recess 11 of the tray 10. The washer 20 can also be made of graphite and it, too, has a substantially segment-shaped cylindrical form. Thus, the outer peripheral wall of the washer has a circular face 21 adjoining the ends of a planar face 22, as shown in FIGS. 3, 4 and 6. The shape of each washer is made to conform to that of the recesses 11, shown in FIG. 1. It should be noted that both the washer 20 and the recesses 11 have planar walls 22 and 13 so that when a washer is fitted into a recess it cannot be turned.

Thus, the transistor components within each recess are held in place by a washer and are protected from vibrations which might otherwise disturb the critical arrangement of these components when the tray is handled and passed through the fusing oven. Each washer 20 is also provided with a slot 23 which is positioned so that it conforms with the channel 16 when it is resting in a recess 11 of the tray 10. This slot 23 acts as an aid in properly aligning the base tab 19 should such be necessary after the washer has been inserted into a recess. Furthermore, each washer is adapted to hold an emitter material 24, such as a small bead of indium, as shown in FIG. 7. Thus, the washer 20, as may be seen in FIGS. 1 through 7, is provided with a depressed circular section 25 and has a tapered hole 26 extending therethrough along the axis of the washer.

By referring now to FIG. 7, it can be understood that once each recess 11 of the tray 10 is properly filled with a collector material 17, a semiconductor crystal chip 18, and a base tab 19 and these components are properly aligned, a washer 20 having a bead of emitter material 24 therein can be placed into each recess to aid in holding the transistor components therein in place. when the washer is inserted into a recess the emitter material 24 is positioned above the chip 18 and is directly opposed to the collector material 17. Thus, all the transistor components are properly aligned and ready to be fused.

Figure 8:
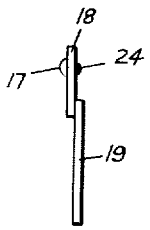
FIG. 8 is a side view of a finished transistor assembly.

The tray can now be placed in a suitable oven for a predetermined period of time and heated to a temperature above the melting point of indium and the lead-tin solder, but below that of germanium. In this particular embodiment, an oven temperature of about 600° C. would be satisfactory. The cylinder of p-type indium 17 will melt, tend to assume a spherical shape. wet the n-type germanium chip 18, and begin to alloy into the chip. On the opposite side of the chip, the indium bead 24 will melt and begin to alloy into the upper side of the chip. Likewise, the solder on the pre-tinned base tab 19 will melt and the tab will be joined to an end section of the chip. After a certain period of time, this time being dependent upon the diffusion rates of the collector and emitter materials, the junction width desired, size of the chip utilized, and other transistor characteristics and requirements well known in the art, the tray is removed from the oven, cooled and the transistor assemblies, of the type shown in FIG. 8, are removed. In this particular embodiment of the invention, this assembly comprises an n-type single crystal germanium chip 18, a p-type collector 17 and emitter 24, and a nickel base tab 19 connected to an end section of the chip. Thus, a p-n-p type fused junction transistor can be formed in which all of the basic components have been simultaneously fused by utilizing the mold assembly described above.

However, it should be understood that this invention is not limited to the particular details described above, as many equivalents will suggest themselves to those skilled in the art. For example, the collector and emitter materials can be varied as desired, as may the type of semiconductor material used, to form n-p-n type transistors. Likewise, the number of recesses to be formed in a single tray may be decreased or increased. Furthermore, though graphite trays and washers have been found to be quite successful for the purposes of this invention, other materials which will not interfere with the fusing process described above can be used as well. Therefore, it is desired that the appended claims be given a broad interpretation commensurate with the scope of the invention within the art.

What is claimed is:

1. A method of forming a fused junction type transistor assembly which comprises pre-positioning a collector material of one type electrical conductivity, a semi-conductor member of a second type of electrical conductivity, an emitter material of said first type electrical conductivity, and a pre-tinned base strip in a mold assembly, said mold assembly being adapted to hold said collector material unconnectedly adjacent to one face of said semiconductor member, said emitter material unconnectedly adjacent to another face of said semiconductor member and opposed to said collector material, and said strip on an end section of said semiconductor member, all of the foregoing steps being performed before any heat is applied to said assembly, and then simultaneously heating said mold assembly and the components therein to a predetermined temperature, said temperature being substantially above the melting point of said collector material, said emitter material and the tinning material, but below the melting point of said semiconductor member whereby said collector and emitter materials are alloyed into said semiconductor member and said strip is joined to said semiconductor member to form a fused junction type transistor assembly.

2. The method of forming a fused junction type transistor assembly, said method comprising placing a collector material of one type electrical conductivity unconnectedly adjacent one face of a semiconductor member of a second type electrical conductivity, placing an emitter material of said first type electrical conductivity unconnectedly adjacent another face of said semiconductor member and opposed to said collector material, placing a pre-tinned base strip unconnectedly adjacent an end section of said semiconductor member, all of the foregoing steps being performed before any heat is applied to said assembly, and the simultaneously heating said semiconductor member, said emitter material, said collector material, and said base strip to a predetermined temperature being substantially above the melting point of said emitter material, said collector material, and said tinning material, but below the melting point of said semiconductor member, whereby said emitter and collector materials are alloyed into said semiconductor member and said strip is joined to said semiconductor member to form a fused junction type transistor assembly.

References Cited in the file of this patent

UNITED STATES PATENTS

| | | |
|---|---|---|
| 789,791 | Sargent | Sept. 22, 1903 |
| 1,607,508 | Bottrill | Nov. 16, 1926 |
| 2,381,025 | Addink | Aug. 7, 1945 |
| 2,597,028 | Pfann | May 20, 1952 |
| 2,748,325 | Jenny | May 29, 1956 |
| 2,756,483 | Wood | July 31, 1956 |
| 2,758,261 | Armstrong et al. | Aug. 7, 1956 |
| 2,796,562 | Ellis et al. | June 18, 1957 |
| 2,862,470 | Williams | Dec. 2, 1958 |

UNITED STATES PATENT OFFICE

CERTIFICATE OF CORRECTION

Patent No. 3,089,219

May 14, 1963

John R. Williams

It is hereby certified that error appears in the above numbered patent requiring correction and that the said Letters Patent should read as corrected below.

Column 1, line 23, for "employ" read -- employing --; column 4, line 51, for "the" read -- then --; lines 53 and 54, after "temperature" insert -- , said temperature --; line 54, for "point" read -- points --; line 65, for "789,791" read -- 739,791 --.

Signed and sealed this 24th day of December 1963.

(SEAL)
Attest:

ERNEST W. SWIDER

Attesting Officer

EDWIN L. REYNOLDS

Acting Commissioner of Patents